(12) United States Patent
Lutgen et al.

(10) Patent No.: US 8,178,372 B2
(45) Date of Patent: May 15, 2012

(54) METHOD FOR PRODUCTION OF A PLURALITY OF SEMICONDUCTOR CHIPS, AND A SEMICONDUCTOR COMPONENT

(75) Inventors: Stephan Lutgen, Regensburg (DE);
Tony Albrecht, Bad Abbach (DE);
Wolfgang Reill, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1186 days.

(21) Appl. No.: 11/541,132

(22) Filed: Sep. 28, 2006

(65) Prior Publication Data

US 2010/0124246 A1    May 20, 2010

(30) Foreign Application Priority Data

Sep. 30, 2005  (DE) .................. 10 2005 047 065
Nov. 30, 2005  (DE) .................. 10 2005 053 274

(51) Int. Cl.
*H01L 21/78* (2006.01)

(52) U.S. Cl. .......... 438/28; 438/604; 438/674; 438/110; 257/E21.599; 257/E33.023

(58) Field of Classification Search ............... 438/28, 438/110, 464, 604, 674
See application file for complete search history.

(56) References Cited

U.S. PATENT DOCUMENTS

| 4,672,736 | A | 6/1987 | Westermeier |
| 7,413,918 | B2 * | 8/2008 | Tran et al. ........... 438/46 |
| 7,432,119 | B2 * | 10/2008 | Doan .................. 438/33 |
| 7,691,656 | B2 * | 4/2010 | Bader et al. ......... 438/29 |
| 2004/0099873 | A1 | 5/2004 | Illek |
| 2005/0098792 | A1 * | 5/2005 | Lee et al. ............. 257/103 |
| 2006/0065905 | A1 | 3/2006 | Eisert et al. |
| 2008/0006836 | A1 * | 1/2008 | Lee .................... 257/98 |

FOREIGN PATENT DOCUMENTS

| DE | 100 40 448 A1 | 3/2002 |
| DE | 102 45 631 A1 | 4/2004 |
| EP | 0176 880 A2 | 9/1985 |

* cited by examiner

*Primary Examiner* — Savitr Mulpuri
(74) *Attorney, Agent, or Firm* — Cozen O'Connor

(57) ABSTRACT

A method for production of a plurality of semiconductor chips (6) in a wafer composite. A semiconductor layer sequence (2) is grown on a growth substrate (1), metallization (3) is applied to the semiconductor layer sequence (2), a metal layer (4) is electrochemically deposited onto the metallization (3), and the semiconductor layer sequence (2) is then structured and separated to form individual semiconductor chips (6). The electrochemically applied metal layer (4) is particularly suitable for use as a heat spreader, for dissipation of the heat produced by the semiconductor chips (6).

14 Claims, 7 Drawing Sheets

METHOD FOR PRODUCTION OF A PLURALITY OF SEMICONDUCTOR CHIPS, AND A SEMICONDUCTOR COMPONENT

RELATED APPLICATIONS

This patent application claims the priority of German patent applications 10 2005 047 065.3 filed Sep. 30, 2005 and 10 2005 053 274.8 filed Nov. 8, 2005, the disclosure content of which is hereby incorporated by reference.

FIELD OF THE INVENTION

The invention relates to a method for production of a plurality of semiconductor chips in the wafer composite, and to a semiconductor component.

BACKGROUND OF THE INVENTION

Semiconductor components, in particular optoelectronic semiconductor components, are generally produced by application of a semiconductor layer sequence to a growth substrate, and subsequent structuring and separation of the semiconductor wafer produced in this way to form a large number of semiconductor chips. Particularly in the case of high-power semiconductor components, during whose operation high power losses occur which must be dissipated as heat from the component, the semiconductor chips are often mounted in the component on a heat sink, for example by means of a soldered joint. Solder mounting of individual semiconductor chips on a heat sink is generally associated with a comparatively large amount of production effort.

During the production of optoelectronic components, for example LEDs or semiconductor lasers, it is often desirable to separate from the semiconductor wafer a growth substrate which is used for epitaxial growth of a semiconductor layer sequence for the optoelectronic component. This is particularly advantageous when the growth substrate is composed of a comparatively costly material, in particular sapphire, silicon carbide or gallium nitride. For example, in the case of so-called thin-film technology, the semiconductor layer sequence of an optoelectronic component is first of all grown epitaxially on a growth substrate, and the semiconductor layer sequence is then connected, on a surface opposite the growth substrate, to a mechanically robust and in general electrically conductive mount, for example composed of germanium, before the growth substrate is removed. The semiconductor layer sequence is in general connected to the mount by wafer bonding or a soldering process. Wafer bonding or soldering in this case require a comparatively large amount of production effort, in order to avoid the formation of gaps or the deposition of particles on the epitaxial semiconductor layer sequence.

SUMMARY OF THE INVENTION

One object of the invention is to provide an improved method for production of a plurality of semiconductor chips in the wafer composite, in which a semiconductor layer sequence which has been applied to a growth substrate is provided with comparatively little production effort with a layer which is particularly suitable for use as a mechanically robust mount for the semiconductor chips, is distinguished by good thermal conductivity, and can thus act as a heat spreader. A further object is to provide a semiconductor component which contains at least one semiconductor chip with a layer such as this.

These and other objects are attained in accordance with one aspect of the invention directed to a method for production of a plurality of semiconductor chips in a wafer composite, in which a semiconductor layer sequence is grown on a growth substrate, metallization is applied to the semiconductor layer sequence, a metal layer is electrochemically deposited onto the metallization, and the semiconductor layer sequence is then structured and separated to form individual semiconductor chips.

Since the electrochemical deposition of the metal layer is carried out at wafer level, that is to say even before the structuring and separation of the semiconductor layer sequence to form individual semiconductor chips, the semiconductor layer sequence is provided with an electrically and thermally conductive layer (which is particularly suitable for use as a heat spreader), with comparatively little production effort and cost outlay.

The method according to such an embodiment of the invention is thus particularly suitable for the production of semiconductor components during whose operation a comparatively large power loss must be dissipated in the form of heat. The method is particularly preferably used for production of a plurality of optoelectronic semiconductor chips, in particular LEDs, laser diodes, surface-emitting semiconductor lasers such as VCSELs or VECSELs, solar cells, detectors or modulators. Alternatively, the method can also be used for the production of semiconductor components such as microprocessors or storage media, based, by way of example, on silicon or germanium.

The electrochemically produced metal layer preferably contains a metal of high thermal conductivity, in particular gold, silver or copper. The thickness of the metal layer is preferably 30 μm or more. Furthermore, the metal layer is preferably no thicker than 300 μm. The electrochemically applied metal layer thus advantageously has a thickness from and including 30 μm up to and including 300 μm, and is thus in general considerably thicker than the semiconductor layer sequence, whose thickness is typically less than 10 μm.

The electrochemically applied metal layer advantageously acts as a mechanically robust mount for the semiconductor layer sequence and may, for example, reduce bending of the semiconductor layer sequence during subsequent process steps, in particular during installation of the semiconductor chips after they have been separated.

Furthermore, the metal layer can also advantageously be electrochemically deposited on a semiconductor layer sequence which has a non-planar structure. In this case, that surface of the electrochemically applied metal layer which faces away from the non-planar structure of the semiconductor layer sequence can be at least largely planar, particularly if the metal layer has a thickness which is large in comparison to the height differences of the non-planar structure. Subsequent installation of the semiconductor chips on a mount, in particular on a planar mount, is simplified in this way. The production effort is in this case comparatively small in comparison to installation of the semiconductor chips on a structured mount, for example on a structured heat sink.

The metallization is preferably provided with a mask layer before the electrochemical deposition of the metal layer, in order to allow the metal layer to be deposited in a structured form.

In particular, the mask layer may be structured in the form of a chip raster. This should be understood as meaning that the mask layer has a plurality of recesses, whose cross-sectional area is at least approximately the same as the cross-sectional area of the semiconductor chips which are produced by the subsequent structuring and separation from the semiconductor layer sequence. By way of example, the mask layer may have rectangular or square recesses with an edge length from and including 10 µm up to and including 5000 µm. The metal layer is preferably applied in a structured form such that the semiconductor layer sequence can subsequently be separated to form semiconductor chips, in such a manner that each semiconductor chip is associated with one and only one area of the structured metal layer.

Alternatively, it is also possible for the mask layer to be structured in such a manner that the semiconductor chips have one or more subareas, which are provided with the electrochemically applied metal layer, after being separated. This advantageously allows structured electrical contacts to be produced, for example for a trapezoidal laser.

The mask layer is preferably a photoresist layer or a non-electrically-conductive dielectric layer. The thickness of the mask layer is advantageously matched to the thickness of the metal layer which is electrochemically deposited. In particular, a mask layer is thus used whose thickness is 30 µm or more.

After the electrochemical application process, the metal layer can be connected to an intermediate mount on a surface facing away from the semiconductor layer sequence. The intermediate mount is, for example, a glass substrate or a silicon wafer. The intermediate mount is preferably connected to the metal layer with a wax layer or a film, in order to allow the intermediate mount to be removed again later with little effort.

The connection of the metal layer to an intermediate mount is particularly advantageous when the metal layer is applied in a structured form to the semiconductor layer sequence and the growth substrate is intended to be removed from the semiconductor layer sequence. The intermediate mount facilitates mechanical handling of the semiconductor layer sequence during detachment of the growth substrate and/or during further process steps, in particular during structuring of the semiconductor layer sequence to form individual semiconductor chips.

The growth substrate is advantageously removed after the electrochemical deposition of the metal layer. By way of example, the growth substrate can be removed from the semiconductor layer sequence by means of an etching process. In the case of a transparent growth substrate, in particular a sapphire substrate, a laser lift-off method can also be used for separation of the growth substrate from the semiconductor layer sequence.

As an alternative to the connection of the metal layer to an intermediate mount, the electrochemically applied metal layer can itself act as a mechanically robust mount for the semiconductor layer sequence, particularly if it is applied over the entire area of the semiconductor layer sequence. The electrochemically applied metal layer in this case preferably has a thickness of 70 µm or more. In particular, the electrochemically applied metal layer may be provided as a mechanically robust mount for the semiconductor layer sequence for subsequent process steps on the side facing the growth substrate on the semiconductor layer sequence, for example removal of the growth substrate and subsequent coating and/or structuring processes. In this case, it is advantageously possible to dispense with the connection of the surface of the semiconductor layer sequence facing away from the growth substrate to a mount by means of wafer bonding or soldering. This is particularly advantageous because the risk of the creation of gaps and/or deposits of undesirable particles on the semiconductor layer sequence during electrochemical deposition of the metal layer is advantageously low in comparison to wafer bonding or soldering.

In comparison to the connection of the semiconductor layer sequence to a mount by means of a soldering process, the electrochemical deposition of the metal layer has the advantage that the electrochemical deposition process can be carried out at a comparatively low process temperature. For example, the metal layer can be electrochemically deposited at a temperature from and including 20° C. up to and including 100° C.

The comparatively low process temperature for the electrochemical deposition of the metal layer is particularly advantageous when the semiconductor material on which the semiconductor layer sequence is based and the metal layer have different thermal coefficients of expansion. By way of example, this is the case with a semiconductor layer sequence which is based on an arsenide compound semiconductor, such as gallium arsenide, which has a thermal coefficient of expansion of about $6*10^{-6}$ $K^{-1}$, onto which a gold layer is electrochemically applied, which has a thermal coefficient of expansion of about $14*10^{-6}$ $K^{-1}$.

The structuring of the semiconductor layer sequence to form semiconductor chips is preferably carried out after the removal of the growth substrate. During the structuring of the semiconductor layer sequence to form semiconductor chips, subareas of the semiconductor layer sequence which are of the same size as a semiconductor chip are separated from one another, preferably by the production of etched trenches by means of an etching process, for example by means of wet-chemical etching or by means of a dry-etching process. After this, the structured semiconductor layer sequence is then advantageously provided with a protective layer, for example a photoresist.

The semiconductor layer sequence is then separated by means of a separation process, for example by sawing, laser cutting or etching, to form individual semiconductor chips. During the separation process, the metallization and/or the metal layer are/is cut through. Before the separation process, it is possible to measure and to appropriately identify the electronic and/or optical characteristics of the semiconductor chips, using the metallization as a rear-face contact.

After being separated, the semiconductor chips can be mounted, for example using blank mounting, in a component housing or on a mount body, for example a heat sink. In this case, adhesive bonding or clamping techniques can also be used as an alternative to soldering processes, and these are associated with comparatively little production effort and cost outlay.

A semiconductor component according to an embodiment of the invention contains at least one semiconductor chip, which contains a semiconductor layer sequence and metallization applied to the semiconductor layer sequence, with a metal layer being applied to the metallization, which metal layer is preferably electrochemically deposited and, in particular, is a gold layer, a silver layer or a copper layer.

The thickness of the metal layer is preferably 30 µm or more. The thickness of the metal layer is furthermore advantageously no more than 300 µm. In this case, the metal layer is sufficiently thick to make it suitable for use as a heat spreader and/or a mount for the semiconductor layer sequence, but on the other hand is still sufficiently thin that the semiconductor chip is suitable for mounting in a housing with comparatively small physical height, in particular in an LED housing.

A growth substrate which is suitable for growing, in particular for epitaxial growing, of the semiconductor layer sequence is preferably not included in the semiconductor chip. A growth substrate which is used for growing of the semiconductor layer sequence may, for example, have been removed by means of an etching process or a laser lift-off process from the semiconductor layer sequence of the semiconductor chip.

The semiconductor component is preferably an optoelectronic component, for example an optoelectronic component which receives or emits radiation. In particular, the optoelectronic component may be a light-emitting diode, for example an LED, or a laser diode. Alternatively, the optoelectronic component may also be a surface-emitting semiconductor laser, for example a VCSEL (Vertical Cavity Surface Emitting Laser) or a VECSEL (Vertical External Cavity Surface Emitting Laser).

The semiconductor chip is preferably mounted on a mount, for example a component housing or a heat sink. The metal layer is advantageously arranged between the mount and the semiconductor layer sequence. The metal layer may in this way act in particular as a heat spreader, that is to say it spreads out the heat originating from the semiconductor chip parallel to its layer plane, and emits the heat produced by the semiconductor chip to the mount.

DETAILED DESCRIPTION OF THE DRAWINGS

Identical elements or components having the same effect are provided with the same reference symbols in the figures. The illustrated elements cannot be regarded as being true to scale, and in fact individual elements are illustrated in an exaggeratedly large form in order to assist understanding.

Figure 1A:
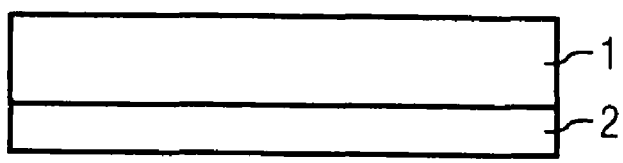
FIGS. 1A, 1B, 1C, 1D, 1E, 1F, 1G and 1H show a schematic illustration of one exemplary embodiment of the method according to the invention, on the basis of intermediate steps.

In the intermediate step illustrated in FIG. 1A for a first exemplary embodiment of a method according to the invention, a semiconductor layer sequence 2 has been grown on a growth substrate 1. By way of example, the growth substrate 1 is a semiconductor substrate, in particular composed of gallium arsenide, gallium nitride or silicon carbide, or a sapphire substrate. The growth substrate 1 may be thinned before the growth of the semiconductor layer sequence 2, for example to a thickness of less than 200 μm. By way of example, the growth substrate 1 may be a gallium-arsenide substrate with a thickness of 115 μm.

The semiconductor layer sequence 2 is preferably grown epitaxially on the growth substrate 1, for example by metalorganic vapor-phase epitaxy (MOVPE), or some other epitaxial growth method. The thickness of the semiconductor layer sequence 2 is typically about 5 μm to about 10 μm.

The semiconductor layer sequence 2 is preferably a semiconductor layer sequence which is suitable for the production of an optoelectronic semiconductor component which emits or receives radiation. In particular, the semiconductor layer sequence 2 may be based on a nitride compound semiconductor, arsenide compound semiconductor or phosphide compound semiconductor. This means that the semiconductor layer sequence 2 preferably comprises $In_xAl_yGa_{1-x-y}N$ or $In_xAl_yGa_{1-x-y}As$ or $In_xAl_yGa_{1-x-y}P$, where $0 \leq x \leq 1$, $0 \leq y \leq 1$ and $x+y \leq 1$.

Figure 1B:
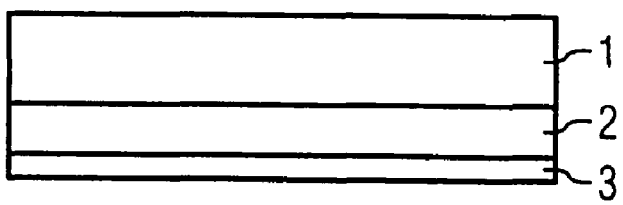

In the intermediate step illustrated in FIG. 1B, metallization 3 has been grown on the semiconductor layer sequence 2. By way of example, the metallization 3 may have a thickness of about 1 μm. The metallization 3 may be applied, for example, by means of a PVD (Physical Vapor Depositing) method, in particular by means of sputtering, to the semiconductor layer sequence 2. The metallization 3 is formed from one or more electrically conductive layers, which each contain a metal or a metal alloy. The metallization 3 is preferably a layer or a layer sequence which is suitable for formation of a p-side contact or n-side contact to the adjacent semiconductor layer sequence 2. In particular, the metallization 3 may be a chrome/platinum/gold layer sequence. Furthermore, the metallization 3 may be a layer which increases reflection, and for example contains silver, gold or aluminum. This is particularly advantageous when optoelectronic semiconductor chips which emit radiation are produced from the semiconductor layer sequence 2.

Figure 1C:
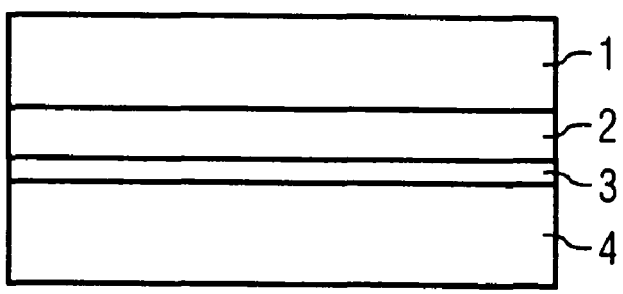

In the intermediate step illustrated schematically in FIG. 1C, a metal layer 4 has been electrochemically deposited on the metallization 3. The electrochemically deposited metal layer 4 has a thickness of 30 μm or more, preferably in the range from and including 30 μm up to and including 300 μm. During the electrochemical deposition of the metal layer 4, the previously applied metallization 3 acts as an electrical contact layer.

The electrochemical deposition of the metal layer 4 is advantageously carried out at a comparatively low process temperature of typically about 20° C. to 100° C. This is particularly advantageous when a metal layer 4 is electrochemically deposited whose thermal coefficient of expansion differs from the thermal coefficient of expansion of the semiconductor layer sequence 2 since, because of the low process temperature for the electrochemical deposition in comparison with soldering processes or wafer-bonding processes which are carried out at higher process temperatures, only comparatively minor mechanical stresses occur. Mechanical stresses such as these could otherwise lead to crack formation.

The metal layer 4 is preferably composed of a metal with high thermal conductivity. In particular, the metal layer 4 may be a gold layer, a copper layer or a silver layer. Because it is comparatively thick and has good thermal conductivity, the electrochemically deposited metal layer 4 represents a mechanically robust mount and an efficient heat spreader during the subsequent process steps.

Figure 1D:
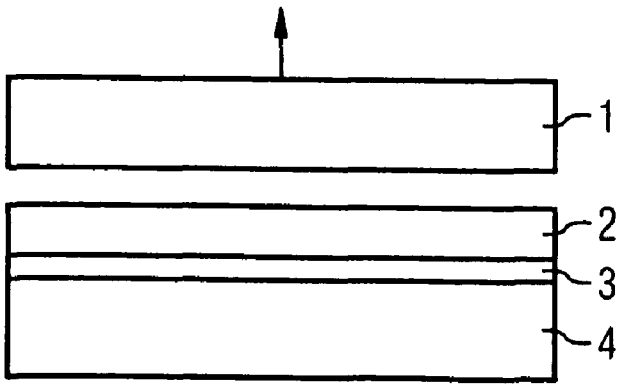

In one preferred embodiment of the invention, as is illustrated schematically in FIG. 1D, the growth substrate 1 is detached from the semiconductor layer sequence 2. In the case of a transparent growth substrate 1, for example a sapphire substrate, the substrate can be detached using a laser lift-off method. Alternatively, the growth substrate 1 can also be detached from the semiconductor layer sequence 2 by means of an etching process, or in some other way.

Figure 1E:
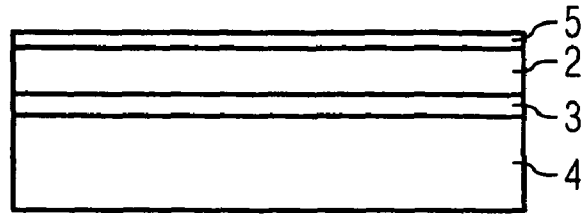

Once the growth substrate 1 has been detached, a layer or layer sequence 5, as illustrated in FIG. 1E, can be applied to the side of the semiconductor layer sequence 2 facing away from the metal layer 4. The layer or layer sequence 5 is, for example, contact metallization which is provided in order to form a second electrical contact, opposite the metallization 3, for the semiconductor layer sequence 2.

Furthermore, the layer or layer sequence 5 may also be a reflection-reducing layer or layer sequence which, in particular, reduces reflection losses on radiation input or output from the semiconductor layer sequence 2 in the case of an optoelectronic component. In this case, the layer or layer sequence 5 may in particular contain one or more dielectric layers, for example a silicon dioxide layer or a silicon nitride layer.

Figure 1F:
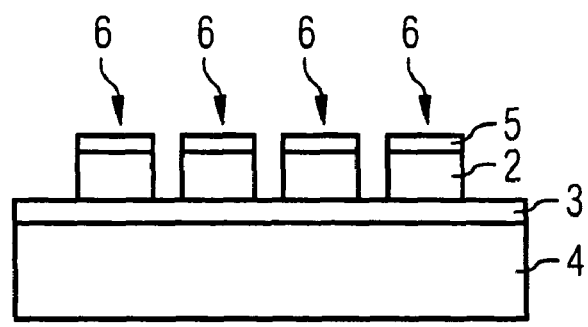

In a further intermediate step, which is illustrated in FIG. 1F, the semiconductor layer sequence 2 including the applied layer or layer sequence 5 has been structured to form semiconductor chips 6. The structuring may be carried out, for example, by wet-chemical etching or a dry-etching process.

After the structuring, it is possible to in each case make contact with the semiconductor chips 6 on a contact layer 5 and on the opposite metallization 3, and in this way to measure, and if required appropriately to mark the electrical and/or optical characteristics of the semiconductor chips 6.

Figure 1G:
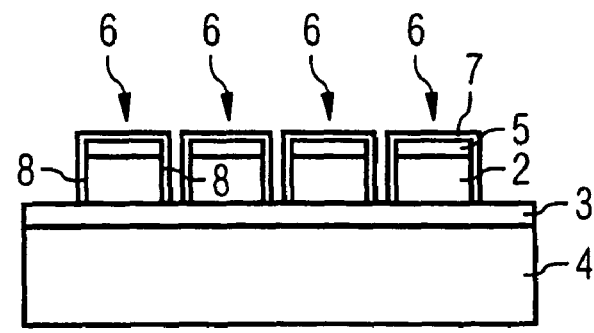

In the intermediate step illustrated in FIG. 1G, a protective layer 7 has advantageously been applied to the semiconductor chips 6, including their side edges 8. The protective layer 7 which, for example, is a photoresist protects the semiconductor chips 6, in particular their side edges 8, against damage during a subsequent separation process, in order to separate the semiconductor chips 6. This advantageously reduces the risk of microcracks occurring on the side edges 8 of the semiconductor layer sequence 2 or of a pn-junction, which by way of example is contained in the semiconductor layer sequence 2, being short-circuited.

Figure 1H:
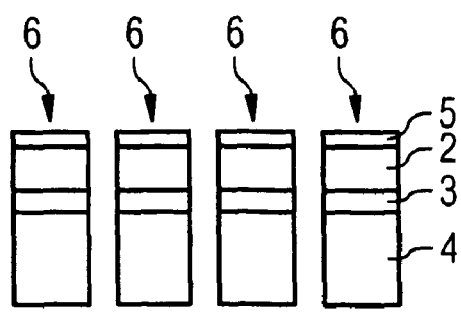

In the intermediate step illustrated in FIG. 1H, the semiconductor chips 6 have been separated by cutting through the metal layer 4, including the metallization 3. The semiconductor chips 6 are separated, by way of example, by sawing, laser separation or etching. Furthermore, in the case of the semiconductor chips illustrated in FIG. 1H, the previously applied protective layer 7 has been removed from the semiconductor chips 6, after the separation process.

The separated semiconductor chips 6 can be mounted in a semiconductor component in a subsequent method step, for example by soldering, adhesive bonding or a clamping technique, in order in this way, for example, to produce one of the semiconductor components according to the invention, as illustrated in FIG. 2, 3, 4 or 5.

Figure 2:
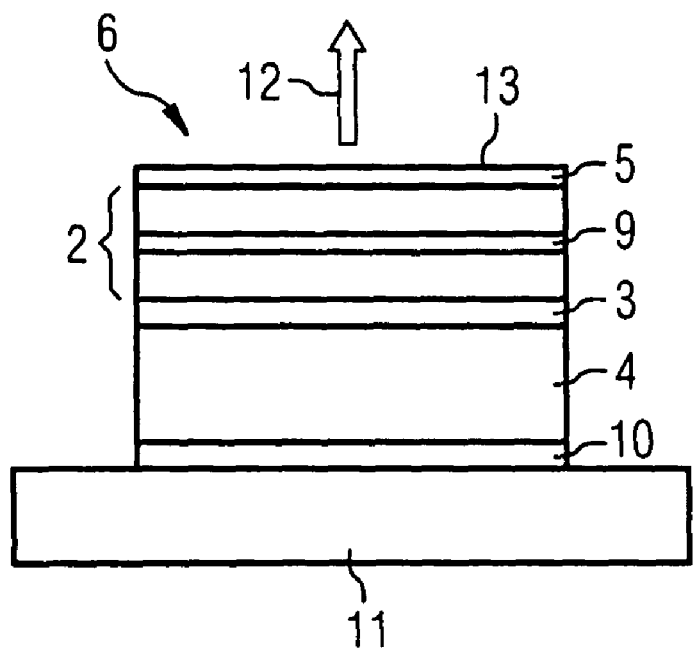
FIG. 2 shows a schematic illustration of a cross section through a first exemplary embodiment of a semiconductor component according to the invention.

The first exemplary embodiment of a semiconductor component according to the invention, as illustrated in FIG. 2, is an optoelectronic component which emits radiation and contains a semiconductor chip 6 which has a semiconductor layer sequence 2. In particular, the optoelectronic component illustrated in FIG. 2 may be a light-emitting diode.

The semiconductor layer sequence 2 contains an active layer 9 which emits electromagnetic radiation 12, for example infrared, visible or ultraviolet radiation. The active layer 9 preferably contains a III-V compound semiconductor material, in particular $In_xAl_yGa_{1-x-y}N$, $In_xAl_yGa_{1-x-y}P$ or $In_xAl_yGa_{1-x-y}As$ where $0 \leq x \leq 1$, $0 \leq y \leq 1$ and $x+y \leq 1$. The active layer 9 is, for example, in the form of a single heterostructure, double-heterostructure, single quantum well structure or multiple quantum well structure. The expression quantum well structure for the purposes of the application covers any structure in which charge carriers have their energy states quantized by confinement. In particular, the expression quantum well structure does not include any details of the dimensions of the quantization. It thus covers, inter alia, quantum wells, quantum wires and quantum dots, and any combination of these structures.

Furthermore, the semiconductor chip 6 contains metallization 3. The metallization 3 is, for example, a chromium/platinum/gold layer sequence and is used in particular to make electrical contact with the semiconductor layer sequence 2. By way of example, a contact layer or contact layer sequence 5, which is applied to the semiconductor layer sequence 2, is provided as further electrical contact for the optoelectronic component. The contact layer 5 is preferably a transparent contact layer which, in particular, may contain a transparent conductive oxide (TCO) such as ITO. The contact layer 5 may also be applied in a structured form to the semiconductor layer sequence 2 (not illustrated). This makes it possible, for example, to cut out one subarea of the radiation outlet surface 13 of the optoelectronic component from the contact layer, in order to reduce absorption losses.

An electrochemically applied metal layer 4 is adjacent to the metallization 3 and contains a metal with comparatively high thermal conductivity. The metal layer 4 is preferably a gold layer, a copper layer or a silver layer, and advantageously has a thickness from and including 30 μm up to and including 300 μm. Seen from the active layer 3, the metal layer 4 is located opposite the radiation outlet surface 13 of the optoelectronic component.

On the side of the metal layer 4 facing away from the semiconductor layer sequence 2, the semiconductor chip 6, is connected to a mount 11, for example by means of a solder layer 10. The mount 11 is, for example, a leadframe, a metal core board or a ceramic mount which, in particular, may contain aluminum nitride.

Furthermore, the mount 11 may also be a heat sink for the optoelectronic component. For this purpose, the mount 11 may contain a metal or a metal alloy with high thermal conductivity, for example copper, and/or may have micro channels through which liquid flows. The heat which is produced during operation of the optoelectronic component is effectively dissipated from the semiconductor layer sequence 2 via the metal layer 4, which acts as a heat spreader, and is emitted, for example, via the mount 11. In this case, it is advantageous for there to be no growth substrate between the semiconductor layer sequence 2 and the metal layer 4, which would otherwise make it harder to dissipate the heat.

Figure 3:
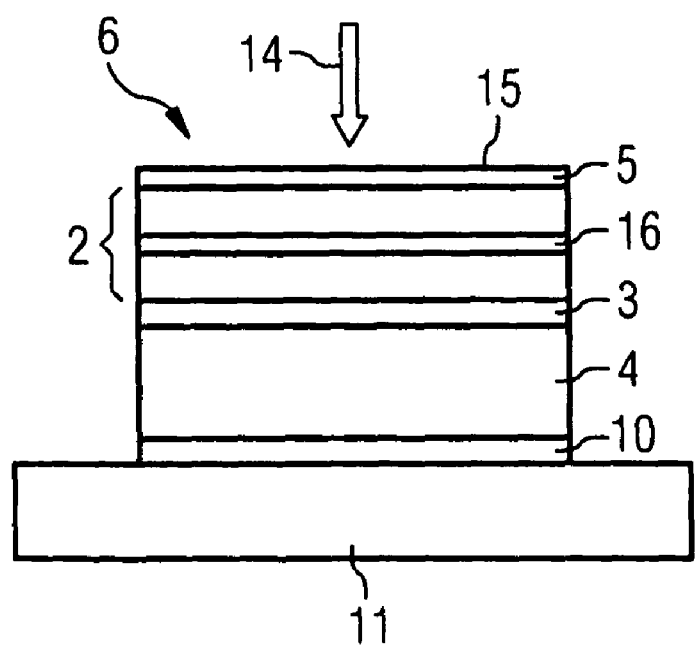
FIG. 3 shows a schematic illustration of a cross section through a second exemplary embodiment of a semiconductor component according to the invention.

The second exemplary embodiment of a semiconductor component according to the invention, as illustrated in FIG. 3, is an optoelectronic component which receives radiation, for example a radiation detector or a solar cell. This contains a semiconductor chip 6 which contains a semiconductor layer sequence 2 with a radiation-sensitive layer 16. The electromagnetic radiation 14 which enters the semiconductor chip 6 on the radiation inlet surface 15 is detected in the radiation-sensitive layer 16. The radiation inlet surface 15 is, for example, the surface of a preferably transparent p-contact layer 5. The p-contact layer 5 is located opposite the n-contact metallization 3, seen from the radiation-sensitive layer 16, and this n-contact metallization 3 is preferably a layer which reflects the incident radiation 14. This reduces absorption losses in the contact metallization 3 and/or in the metal layer 4.

Further advantageous refinements of the second exemplary embodiment as illustrated in FIG. 3 correspond to the first exemplary embodiment illustrated in FIG. 2. In particular, the electrochemically produced metal layer 4 advantageously acts as a heat spreader for the heat which is produced in the optoelectronic component which receives radiation.

Figure 4:
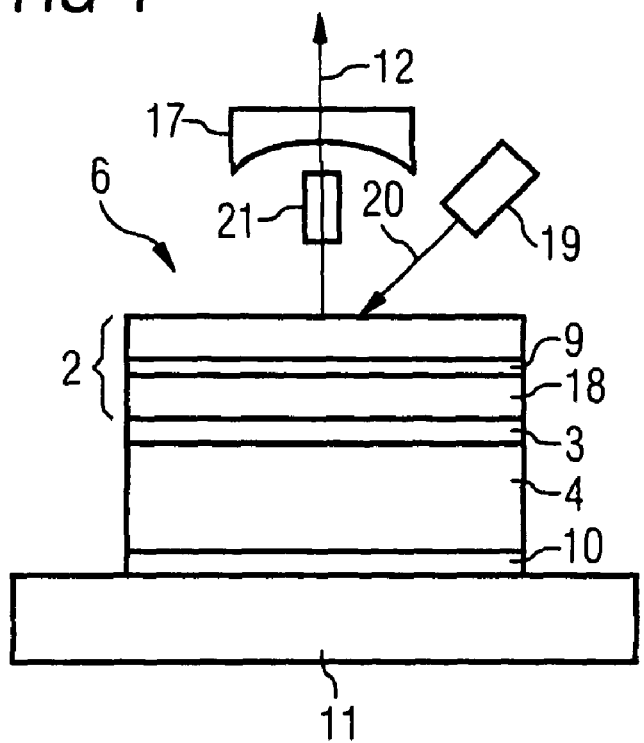
FIG. 4 shows a schematic illustration of a cross section through a third exemplary embodiment of a semiconductor component according to the invention.

The semiconductor component according to a third exemplary embodiment of the invention, as illustrated in FIG. 4, is a surface-emitting semiconductor laser with an external resonator (VECSEL). The semiconductor layer sequence 2 in the surface-emitting semiconductor laser contains an active layer 9 which emits radiation and is arranged within a laser resonator. The laser resonator is formed by a first external resonator mirror 17 arranged outside the semiconductor chip 6, and a second resonator mirror 18 arranged within the semiconductor chip 6 which may, in particular, be a Bragg mirror.

The active layer 9 which emits radiation is, for example, optically pumped by a pump radiation source 19, which injects pumped radiation 20 into the semiconductor chip 6. The pumped radiation source 19 is, for example, a laser diode.

Alternatively, the active layer 9 can also be optically pumped by means of pumping lasers integrated monolithically in the semiconductor chip or electrical pumping by current injection into the active layer 9 which emits radiation (not illustrated). Furthermore, in contrast to the exemplary embodiment illustrated in FIG. 4, it is also possible for the surface-emitting semiconductor laser to be a VCSEL, in which the first resonator mirror is also integrated in the semiconductor chip. Embodiments such as these of surface-emitting semiconductor lasers are known per se to those skilled in the art, and will therefore not be explained in any more detail at this point.

The laser resonator in the surface-emitting semiconductor laser preferably contains an element 21 which is suitable for frequency conversion of the emitted radiation 12. The frequency conversion element 21 is preferably a non-linear optical crystal. The frequency conversion element 21 advantageously multiplies the frequency, in particular by doubling the frequency, of the emitted laser radiation 12. By way of example, this makes it possible to convert infrared radiation emitted from the active layer 9 to visible light, in particular to green or blue visible light.

As in the case of the two exemplary embodiments already described, the electrochemically produced metal layer 4 acts as a heat spreader and thus advantageously dissipates the heat produced by the surface-emitting semiconductor laser to the surrounding area or to a mount 11, for example a heat sink. Otherwise, the advantageous refinements described for the exemplary embodiments that have already been mentioned also apply to the third exemplary embodiment.

Figure 5:
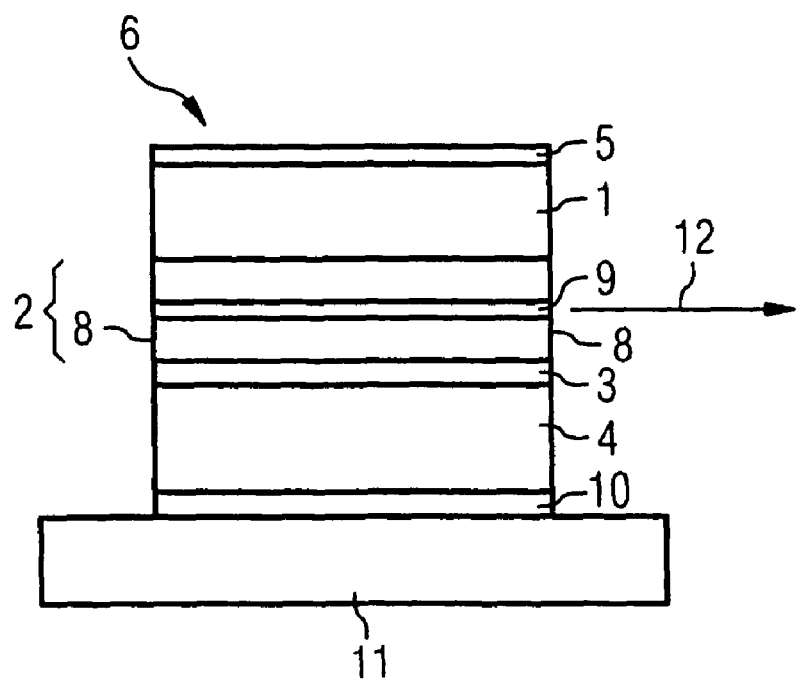
FIG. 5 shows a schematic illustration of a cross section through a fourth exemplary embodiment of a semiconductor component according to the invention.

The fourth exemplary embodiment of a semiconductor component according to the invention, as illustrated in FIG. 5, is an edge-emitting semiconductor laser. The semiconductor layer sequence 2 in the edge-emitting semiconductor laser contains an active layer 9, from which radiation 12 is emitted in a direction which runs parallel to the plane of the active layer 9. The laser resonator in the semiconductor laser is formed by the side edges 8 of the semiconductor chip 6, with the side edges 8 preferably having a coating which increases reflection (not illustrated).

In contrast to the already described exemplary embodiments, the growth substrate 1 has not been removed for the production of the edge-emitting semiconductor laser, and is therefore still included in the semiconductor chip 6. It is advantageously possible to dispense with the removal of the growth substrate 1 for the production of the edge-emitting semiconductor laser, because it is not arranged in the emission direction of the emitted laser radiation 12.

In order to make electrical contact with the edge-emitting semiconductor laser, the growth substrate 1 is advantageously an electrically conductive substrate, in particular an n-doped substrate. In order to make electrical contact with the substrate 1, an n-contact layer 5 is, for example, applied to the surface of the growth substrate 1 facing away from the semiconductor layer sequence 2. A second electrical contact with the edge-emitting semiconductor laser is formed by the metallization 3, which is arranged on the side of the semiconductor layer sequence 2 opposite the growth substrate 1, and preferably forms the p-side contact of the semiconductor layer sequence 2.

The heat which is produced by the edge-emitting semiconductor laser is advantageously dissipated through the electrochemically produced metal layer 4 adjacent to the metallization 3 to a mount 11, which in particular is a heat sink.

A further exemplary embodiment of a method according to the invention is illustrated in FIGS. 6A to 6I on the basis of intermediate steps.

Figure 6A:
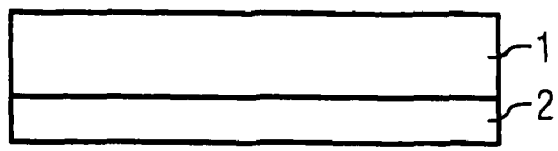
FIGS. 6A, 6B, 6C, 6D, 6E, 6F, 6G, 6H and 6I show a schematic illustration of a further exemplary embodiment of a method according to the invention, based on intermediate steps.
Figure 6B:
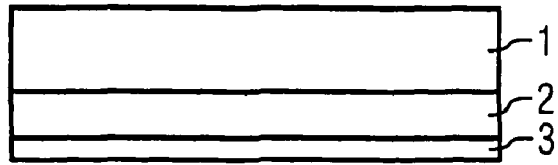

The intermediate steps, as illustrated in FIGS. 6A and 6B, of the growth of a semiconductor layer sequence 2 on a growth substrate 1 and the application of metallization 3 to the semiconductor layer sequence 2 correspond to the intermediate steps illustrated in FIGS. 1A and 1B, and will therefore not be explained in any more detail at this point.

Figure 6C:
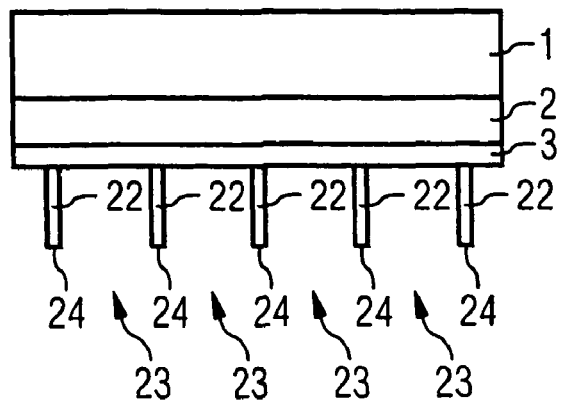

In contrast to the already described first exemplary embodiment of the method according to the invention, a mask layer 22 is applied to the metallization 3 after the application of the metallization 3 to the semiconductor layer sequence 2, as illustrated in FIG. 6C. The mask layer 22 is preferably a photoresist layer or a dielectric layer. The thickness of the mask layer 22 is advantageously matched to the thickness of the metal layer 4 which is electrochemically applied in the subsequent method step. The thickness of the mask layer is preferably more than 30 µm. The mask layer 22 is preferably structured in the form of a chip raster. This means that the mask layer 22 has a large number of recesses 23 which are separated from one another by webs 24, with the recesses 23 preferably having a rectangular or square cross section, with edge lengths from and including 10 µm up to and including 5000 µm, on a plane which runs parallel to the mask layer 22.

Figure 6D:
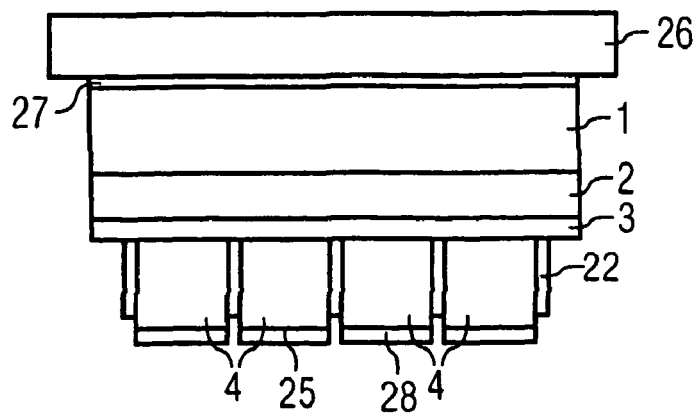

In a following method step, which is illustrated schematically in FIG. 6D, a metal layer 4 is deposited on the metallization 3 that has been provided with the mask layer 22, with the thickness of this metal layer 4 advantageously being at least 30 µm and preferably no more than 300 µm. The metal layer 4 may, in particular, be a silver layer, a gold layer or a copper layer.

Particularly if the electrochemically applied metal layer 4 is comparatively thick, it may possibly be necessary to planarize the surface 25 of the metal layer 4 facing away from the growth substrate 1, for example by grinding, lapping or polishing. In order to improve the mechanical handling capability, the growth substrate 1 may be temporarily connected to an auxiliary mount 26 by the surface facing away from the semiconductor layer sequence 2 during the electrochemical deposition of the metal layer 4 and/or during a subsequent planarization process. The growth substrate 1 is preferably connected to the auxiliary mount 26 by means of a wax layer 27. In this case, the auxiliary mount 26 can be detached from the growth substrate 1 again with comparatively little effort.

The mask layer 22 can then be removed, and/or one or more further layers can be applied to the metal layer 4, for example a solder layer 28. By way of example, the solder layer 28 has a thickness between about 1 µm and about 7 µm. In particular, the solder layer 28 may be provided for subsequent solder mounting of the semiconductor chips, as produced using the method according to the invention, on a mount, for example a heat sink or a leadframe.

Figure 6E:
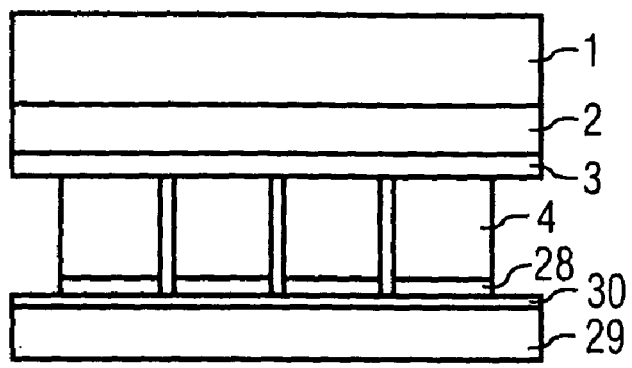

In the intermediate step of the method according to the invention as illustrated in FIG. 6E, the wafer has been connected to an intermediate mount 29 on a side of the metal layer 4 facing away from the semiconductor layer sequence 2, or of the solder layer 28 which may have been applied. The intermediate mount 29 is, for example, a glass substrate or a silicon wafer and, for example, is connected by means of a film or wax layer 30 to the metal layer 4, or possibly the solder layer 28. Furthermore, the intermediate mount 26, which was previously connected to the growth substrate 1, has been removed again in the intermediate step illustrated in FIG. 6E. The intermediate steps of the method as described in the following FIGS. 6F, 6G and 6H have already been explained in detail in conjunction with FIGS. 1E, 1F and 1G and will therefore just be summarized briefly at this point.

Figure 6F:
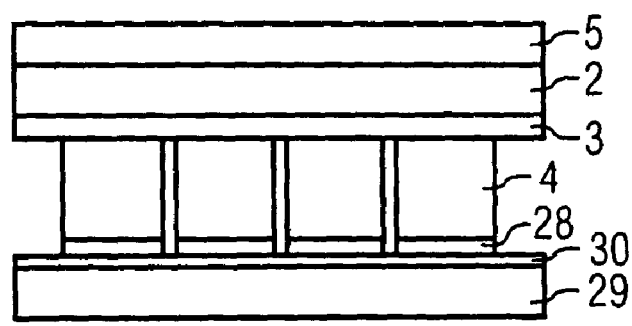

In the intermediate step illustrated in FIG. 6F, the growth substrate 1 has been removed from the semiconductor layer sequence 2 and a layer or layer sequence 5, for example a reflection-reducing layer, has been applied to the semiconductor layer sequence 2.

Figure 6G:
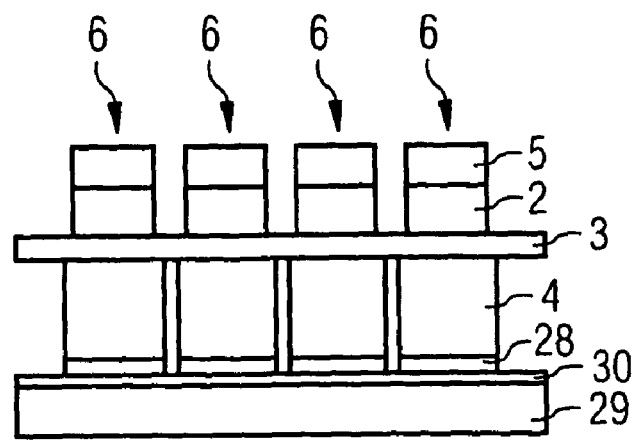

In the intermediate step of the method according to the invention as illustrated in FIG. 6G, the semiconductor layer sequence 2 has been structured to form individual semiconductor chips.

Figure 6H:
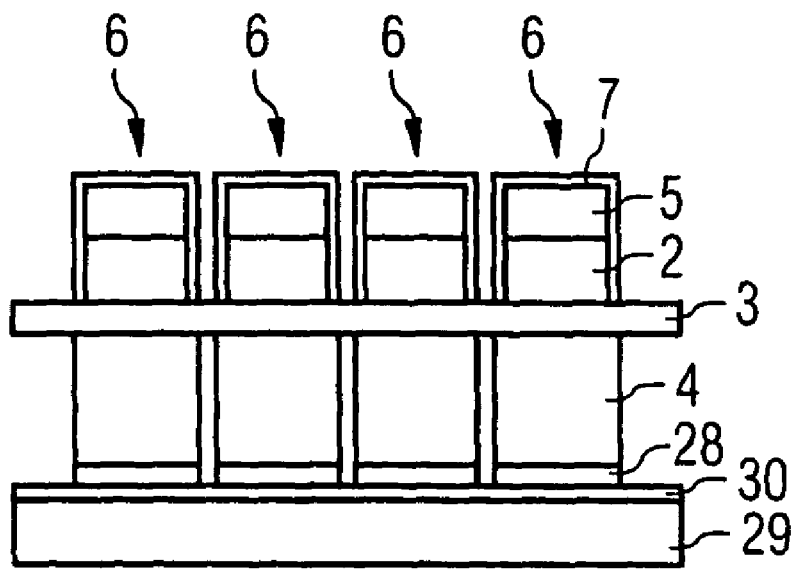

In a further intermediate step, as is illustrated in FIG. 6H, a protective layer 7 has been applied to the semiconductor layer sequence 2, including the possibly applied layer or layer sequence 5.

Figure 6I:
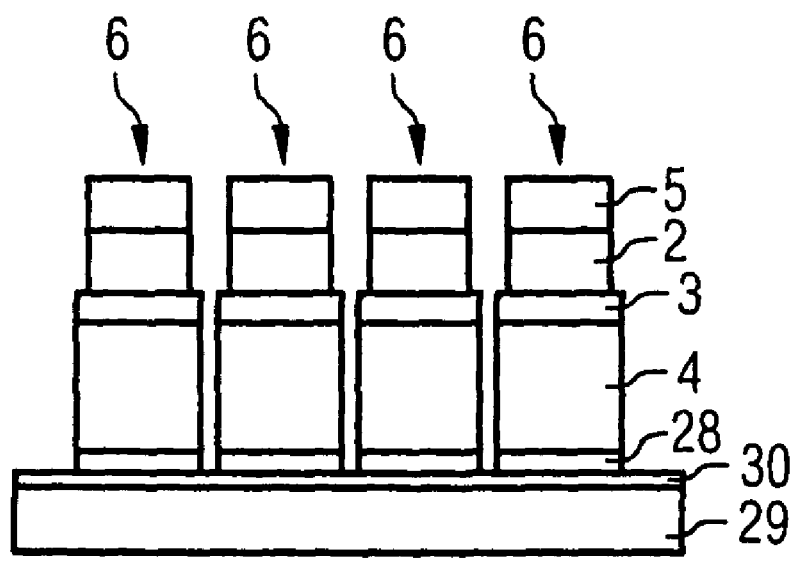

In the intermediate step illustrated in FIG. 6I, the metallization 3 has been cut through in order to separate the semiconductor chips 6, and the protective layer 7 has then been removed from the semiconductor chips 6. Since the metal layer 4 is already structured in a chip raster, there is advantageously no need to cut through the comparatively thick metal layer 4 in order to separate the semiconductor chips 6.

The semiconductor chips 6 which are still arranged on the intermediate mount 29 can then be processed further by means of blank mounting. By way of example, the semiconductor chips 6 are removed from the intermediate mount 29 and are mounted on a mount or in a component housing, for example by production of a soldered joint by means of the solder layer 28. In particular, one of the optoelectronic semiconductor components illustrated in FIG. 2, 3, 4 or 5 can be produced using the method according to the invention.

The invention is not restricted by the description based on the exemplary embodiments. In fact, the invention covers any new feature as well as any combination of features, which in particular includes any combination of features in the patent claims, even if this feature or this combination is not itself explicitly stated in the patent claims or exemplary embodiments.

We claim:

1. A method for production of a plurality of semiconductor chips in a wafer composite, comprising the steps of:
    growing a semiconductor layer sequence on a growth substrate;
    applying a metallization to the semiconductor layer sequence;
    applying a mask layer on the metallization and structuring the mask layer to form a chip raster;
    depositing a metal layer electrochemically onto the metallization in a structured form of said chip raster such that each individual semiconductor chip of the plurality of semiconductor chips is associated with a single, separate area of the structured metal layer; and
    structuring and separating the semiconductor layer sequence to form individual semiconductor chips without cutting through the structured metal layer.

2. The method as claimed in claim 1, wherein the thickness of the metal layer is 30 µm or more.

3. The method as claimed in claim 1, wherein the thickness of the metal layer is 300 µm or less.

4. The method as claimed in claim 1, wherein the metal layer contains gold, silver or copper.

5. The method as claimed in claim 1, wherein the mask layer has a thickness of 30 µm or more.

6. The method as claimed in claim 1, wherein the mask layer is a photoresist layer or a dielectric layer.

7. The method as claimed in claim 1, wherein the metal layer is connected to an intermediate mount on a side facing away from the semiconductor layer sequence.

8. The method as claimed in claim 7, wherein the intermediate mount is a glass substrate or a silicon wafer.

9. The method as claimed in claim 1, wherein the growth substrate is removed from the semiconductor layer sequence after the electrochemical deposition of the metal layer.

10. The method as claimed in claim 1, wherein the metal layer acts at least temporarily as a mount for the semiconductor layer sequence during and/or after the removal of the growth substrate.

11. The method as claimed in claim 9, wherein the structuring of the semiconductor layer sequence to form semiconductor chips is carried out after the removal of the growth substrate.

12. The method as claimed in claim 1, wherein the semiconductor layer sequence is provided with a protective layer after the structuring and before the separation to form semiconductor chips.

13. The method as claimed in claim 1, wherein the metal layer and/or the metallization are/is cut through during separation of the semiconductor chips.

14. The method as claimed in claim 1, wherein the semiconductor chips are mounted by means of blank mounting in a component housing or on a mount, after separation.

* * * * *